United States Patent [19]

Garbis et al.

[11] Patent Number: 4,659,400

[45] Date of Patent: Apr. 21, 1987

[54] METHOD FOR FORMING HIGH YIELD EPITAXIAL WAFERS

[75] Inventors: Danny Garbis, South Huntington; Joseph J. Chan, Kings Park; Amadeo J. Granata, Mount Vernon; Philip Coniglione, Glen Cove; Thomas D. Briglia, Hauppauge; Lawrence E. Laterza, Coram, all of N.Y.

[73] Assignee: General Instrument Corp., New York, N.Y.

[21] Appl. No.: 750,488

[22] Filed: Jun. 27, 1985

[51] Int. Cl.$^4$ .................... H01L 7/36; H01L 21/20
[52] U.S. Cl. .................... 148/175; 29/576 B; 148/1.5; 148/187; 148/DIG. 134; 148/DIG. 135; 156/612; 427/51
[58] Field of Search .................... 148/1.5, 175, 187; 29/576 B; 156/612; 427/51

[56] References Cited

U.S. PATENT DOCUMENTS

| | | | |
|---|---|---|---|
| 3,462,322 | 8/1969 | Henning et al. | 148/DIG. 135 |
| 3,762,945 | 10/1973 | DiLorenzo | 148/175 |
| 3,997,368 | 12/1976 | Petroff et al. | 148/1.5 |
| 4,042,419 | 8/1977 | Heinke et al. | 148/1.5 |
| 4,144,099 | 3/1979 | Edmonds et al. | 148/1.5 |
| 4,149,905 | 4/1979 | Levinstein et al. | 148/1.5 |
| 4,376,657 | 3/1983 | Nagasawa et al | 148/1.5 |
| 4,421,576 | 12/1983 | Jolly | 148/175 |
| 4,509,990 | 4/1985 | Vasudev | 148/1.5 |
| 4,539,050 | 9/1985 | Kramler et al. | 148/1.5 |
| 4,540,452 | 9/1985 | Croset et al. | 148/175 |
| 4,548,654 | 10/1985 | Tobin | 148/1.5 |
| 4,579,601 | 4/1986 | Samata et al. | 148/1.5 |
| 4,597,804 | 7/1986 | Imaoka | 148/1.5 |

OTHER PUBLICATIONS

Borland in Mat. Res. Soc. Proc., vol. 36, ed. Fair et al, (1984), p. 269.
Biedermann et al, IBM-TDB, vol. 19 (1976), 1295.

*Primary Examiner*—Upendra Roy
*Attorney, Agent, or Firm*—James & Franklin

[57] ABSTRACT

A silicon substrate having a controlled oxygen content is sliced to form a wafer. The backside surface of the wafer is mechanically damaged for external gettering, polished, and subjected to heat for annealing to reduce strain and defects near the surface. The surface is then etched and the epitaxial layer formed by first growing an epitaxial layer, removing a substantial portion thereof, and then regrowing the layer to the required thickness. Immediately prior to device processing, an oxide layer is formed by heating the wafer, removing a portion of the epitaxial layer, and placing the wafer in an oxygen atmosphere. After a preselected time period in the oxygen atmosphere, the temperature is gradually reduced.

38 Claims, No Drawings

METHOD FOR FORMING HIGH YIELD EPITAXIAL WAFERS

BACKGROUND OF THE INVENTION

The present invention relates to a method for forming epitaxial wafers from a silicon substrate for use in the fabrication of semiconductor devices and, more particularly, to a method for forming epitaxial wafers which results in significantly increased device yields, particularly for surface fabricated devices such as Schottkey barrier diodes and rectifiers.

Semiconductor devices, including surface fabricated devices such as Schottky barrier diodes and rectifiers, are formed on wafers of epitaxial material which are thereafter diced into chips. The yield, that is, the number of satisfactorily operating chips, as compared to the total number of chips fabricated, is of great importance to a chip manufacturer as the yield, in part, determines the manufacturer's cost per chip.

The yield is determined by various considerations including the degradation of the silicon material of the wafer upon which the devices are formed. The tendency of the silicon material to degrade, in turn, depends upon a variety of factors including impurity levels within the material surface, that is, the concentration of oxygen, carbon, heavy metal and mobile ions. Surface strain and certain surface defects, such as stacking faults, dislocation and vacancies, also contribute to degradation.

The present invention relates to a method for forming epitaxial wafers which controls and minimizes the various factors which contribute to the degradation of the silicon material, thereby reducing failures in the devices formed on the material and, consequently, increasing yields, as well as increasing the performance and overall quality of the finished devices. The method of the present invention includes a number of steps which individually control the various factors contributing to degradation and cumulatively result in a synergistic effect which minimizes the degradation factors to an unexpected degree, thereby increasing the yields to an unanticipated extent.

In general, the process begins with a silicon substrate having a specified oxygen and carbon content, the oxygen acting as an intrinsic getter during device processing. The substrate is sliced into wafers. The backside surface of each wafer is mechanically damaged prior to polishing. The damage sites act as an external getter to remove heavy metals from the electrical junction site in subsequent temperature cycling. The polished substrate is annealed to create a denuded zone so as to reduce strain and defects near the surface which tend to degrade the electrical characteristics of the devices.

A unique two-step epitaxial growth process is utilized to minimize strain, remove mobile ions, and further enhance the denuded zone. An oxide layer is formed by a unique process, preferably immediately prior to device processing. Oxidation is performed after removal of a portion of the epitaxial layer so as to further minimize degradation of the silicon/silicon dioxide interface.

The two-step epitaxial growth process and the process used to form the oxide layer are believed to be each novel in and of themselves, and each of these steps individually, when used in conventional processes, leads to higher yields. However, when these steps are used in combination, an unexpected result is obtained leading to an unanticipated increase in device yield. It is believed that this unexpected result is obtained from the synergistic effect of the combination of these individual steps.

It is, therefore, a prime object of the present invention to provide a method of forming epitaxial wafers which results in significantly increased yields of electrical devices.

It is another object of the present invention to provide a method of forming an epitaxial wafer which employs a unique two-step epitaxial layer formation process.

It is another object of the present invention to provide a method for forming epitaxial wafers which includes a unique oxide layer formation step in which a portion of the epitaxial layer is removed prior to oxidation.

It is another object of the present invention to provide a method for forming an epitaxial wafer wherein the surface of the silicon wafer is subjected to a temperature cycling step for purposes of annealing prior to the formation of the epitaxial layer.

It is another object of the present invention to provide a method of forming epitaxial wafers in which the backside surface of the wafer is mechanically damaged for external gettering.

It is another object of the present invention to provide a method for forming an epitaxial wafer on a silicon substrate which has a specified oxygen content to provide intrinsic gettering during device processing.

BRIEF DESCRIPTION OF THE INVENTION

In accordance with one aspect of the present invention, a method of forming an epitaxial wafer from a silicon substrate is provided. The method comprises the steps of slicing the substrate to form a wafer, annealing the wafer and forming an epitaxial layer. The epitaxial layer is formed by first growing an epitaxial layer, removing a substantial portion of the grown layer, and then regrowing the epitaxial layer to the required thickness.

The method further comprises the step of forming an oxide layer on the wafer surface. The oxide layer is preferably formed immediately prior to processing of the wafer for device fabrication.

The process for growing the epitaxial layer preferably comprises the steps of heating the wafer, growing an epitaxial layer several microns thick, cooling the wafer, and then reheating the wafer.

The step of removing a portion of the grown epitaxial layer preferably comprises the step of removing all of the grown epitaxial layer except for approximately 1 micron thereof.

The step of growing an epitaxial layer further comprises the step of removing a portion of the substrate surface prior to growing the epitaxial layer. The step of removing a portion of the substrate surface comprises the step of removing approximately 3500 angstroms to 5000 angstroms of the substrate.

The oxygen content of the substrate is preferably selected to be approximately 17–20 parts per million. This oxygen content provides the maximum intrinsic gettering during device processing.

The method further comprises the step of subjecting the backside surface of the wafer to mechanical damage after slicing. Preferably, the mechanical damage is provided by scribing the backside surface to form concentric circles.

The method further comprises the step of polishing the back surface of the wafer. The back surface of the wafer is polished prior to annealing.

The method further comprises the step of annealing the wafer prior to growing the epitaxial layer. Annealing includes the steps of heating the wafer for approximately 5 hours at 900° C. in a nitrogen atmosphere, permitting the heated wafer to cool rapidly, removing any deposited oxide from the wafer, and then cleaning the wafer surface.

In accordance with another aspect of the present invention, a method for forming an epitaxial wafer from a silicon substrate is provided. The method comprises the steps of slicing the substrate to form a wafer, annealing the wafer, forming an epitaxial layer, and forming an oxide layer. The oxide layer is formed by heating the wafer to a first temperature, removing a portion of the epitaxial layer, placing the wafer in an oxygen atmosphere for a given time period, and then gradually reducing the temperature to a second temperature.

The step of heating the wafer comprises the step of slowly heating the wafer in a nitrogen atmosphere to approximately 1100° C.

The step of removing a portion of the epitaxial layer comprises the step of etching away approximately 1200 angstroms of the epitaxial layer.

The step of placing the wafer in an oxygen atmosphere comprises the step of heating the wafer for approximately 60 minutes in an oxygen atmosphere.

The step of gradually reducing the temperature comprises the step of reducing the temperature from approximately 1100° C. to approximately 700° C. over a time period of approximately 60 minutes.

The step of forming an oxide layer preferably comprises the step of forming an oxide layer from 1600 angstroms to 1800 angstroms thick. Preferably, the step of forming the oxide layer occurs immediately prior to processing the wafer to form semiconductor devices thereon.

In accordance with another aspect of the present invention, a method for forming an epitaxial wafer from a silicon substrate is provided. The method comprises the steps of slicing the substrate to form a wafer, annealing the wafer, and forming an epitaxial layer. The epitaxial layer is formed by growing an epitaxial layer, removing a substantial portion of the grown layer, and regrowing the epitaxial layer to the required thickness. An oxide layer is then formed. The oxide layer is formed by heating the wafer to a first temperature, removing a portion of the epitaxial layer, placing the wafer in an oxygen atmosphere for a given time period and, thereafter, gradually reducing the temperature to a second temperature.

DESCRIPTION OF THE PREFERRED EMBODIMENTS

To the accomplishment of the above and to such other objects which may hereinafter appear, the present invention relates to a method for forming epitaxial wafers with increased yields as described in the following specification and recited in the annexed claims.

For optimum results, the process of the present invention begins with a silicon substrate with a specified oxygen and carbon content. It has been found that the best yields can be obtained by utilizing a silicon substrate having approximately 20 parts per million free oxygen and, preferably, between 17 and 20 parts per million.

Normally, the oxygen level in the substrate is found to be greatest at the seed end and decreases towards the other end. However, to grow crystals with uniform oxygen level, a technique has been developed where one can add quartz to the melt to replenish the depleted oxygen as the crystal is grown. By this technique, a uniform free oxygen content within the desired range can be obtained. The oxygen within the substrate functions as an intrinsic getter during device processing.

The silicon substrate is then sliced into wafers. The backside surface of each wafer is mechanically damaged. The mechanical damage is preferably performed by scribing the backside surface of the wafer to form, for example, concentric circles. This creates gettering sites to remove the heavy metals from the electrical junction site during subsequent temperature cycling.

The backside surface of the wafer is polished and subjected to a temperature cycling process for annealing. The temperature cycling is performed in a conventional furnace. First, the wafer is heated for approximately 5 hours at 900° C. in a nitrogen atmosphere, preferably replenished at the rate of 3 liters per minute. The wafer is then removed rapidly from the 900° C. temperture zone in the furnace. Preferably, no gradual reduction of the furnace temperature is permitted. The wafers are then immersed in hydrofluoric acid to remove any deposited oxide and rinsed thoroughly with deionized water. After rinsing, the wafers are blown dry with nitrogen, the wafer surfaces are re-cleaned in a high pressure scrubber and dried with nitrogen. Annealing the wafer in this manner creates a denuded zone with a slight oxide content. This reduces strain and defects near the surface of the polished substrate.

Thereafter, the wafers are placed back in the furnace and heated up to approximately 1100° C. in a hydrogen atmosphere. HCl gas is introduced to etch a portion of the surface. Between 3500 angstroms and 5000 angstroms of the surface is removed in this manner. Preferably, approximately 3600 angstroms of the surface is removed.

After etching, the wafer is purged in hydrogen for approximately ten minutes. An epitaxial layer of the required resistivity is then grown on the wafer surface. This epitaxial layer is only a few microns thick and, thus, is substantially thinner than the thickness of the final epitaxial layer. Preferably, the initial epitaxial layer is approximately 3 microns thick and is formed with a growth rate of 0.7 microns per minute.

After formation of the initial epitaxial layer, the wafer is purged in hydrogen for approximately 3 minutes, still at the 1100° C. temperature. The wafer is then allowed to cool down in the hydrogen atmosphere for approximately ten minutes. It is then reheated to the 1100° C. level.

The reheated wafer is subjected to an HCl etch which removes a portion of the initial epitaxial layer, preferably leaving only approximately one micron thereof. The wafer is then purged in a hydrogen atmosphere for another ten minutes.

At this point, the final epitaxial layer is grown. This layer is grown to the resistivity and thickness required for the finished epitaxial layer. Strain and surface defects are removed by this two-step epitaxial layer formation process. In addition, mobile ions are removed and the denuded zone is further enhanced.

After the epitaxial layer has been completed, an oxidation layer is grown prior to device formation. Preferably, the oxidation process should take place immediately before processing the wafer into devices. Thus, if the wafer is to be fabricated into devices at a later time or by a different manufacturer, the oxidation process should take place at that time and may be performed by the device fabricator.

The oxidation process takes place in the oxidation tube of a furnace into which the wafers are slowly loaded, over the course of several minutes, preferably 6 to 7 minutes. The furnace has a temperature zone at approximately 1100° C. and a nitrogen atmosphere is created by introducing approximately 3 liters of nitrogen per minute into the tube. The wafer is then etched by HCl for approximately 16 minutes. Preferably approximately 80 cc's of HCl is required. The HCl etches the surface of the wafer to remove approximately 1200 angstroms thereof. The etch rate is approximately 75 angstroms per minute.

The etched wafer is purged for approximately five minutes in a nitrogen atmosphere, replenished at the rate of approximately 3 liters per minute. An oxygen atmosphere is introduced into the tube for approximately 60 minutes, at a rate of approximately 3 liters per minute. Thereafter, the temperature of the furnace is gradually reduced from 1100° C. to 700° C. over the course of 60 minutes, as the oxygen is continuously replenished. The wafers are then removed from the furnace, a process which takes approximately ten minutes.

The oxidation step initially removes the remaining strain and defects at the surface and then grows the oxide on a strain/defect-free surface. The oxide layer is necessary for further device processing. Preferably, the thickness of the oxide layer is 1600 angstroms to 1800 angstroms.

It has been found through experimentation that the inclusion of either the two-step epitaxial growth process or the oxidation step individually into the conventional epitaxial wafer formation process results in substantial increases in the device yield. However, when these two steps are used in combination, particularly in a process which starts with a substrate of the desired free oxygen level and the external gettering and annealing techniques described above are used, an unexpected result is obtained. The device yield increases in an unanticipated manner. It is believed that the dramatic increase in device yield is a result of the synergistic effect of the combination.

At the present time, the preliminary test data indicates a dramatic increase in device yield over conventional processes. Devices fabricated on wafers from two vendors A and B were tested against those fabricated in accordance with the present invention during five different time periods. All wafers were fabricated using silicon substrates with controlled oxygen content in the range of 17-20 ppm. The backside surface of the wafers were mechanically damaged, polished, and the wafers were annealed as explained above.

The wafers from vendors A and B were fabricated with conventional epitaxial growth processes. The wafers fabricated in accordance with the present invention were subjected to the unique two-step epitaxial growth processes of the present invention.

For each of the first four time periods, the device manufacturer fabricated devices in an identical manner from each of the three sets of wafers. The results were as follow:

| Time Period | Vendor A | Vendor B | Two-Step Epi Process |
| --- | --- | --- | --- |
| 1 | 30.3% | 34.4% | 37.1% |
| 2 | 26.6% | 27.6% | 35.3% |
| 3 | 31.0% | 29.3% | 39.0% |
| 4 | 31.4% | 45.8% | 61.0% |

Comparison between yield figures is only meaningful within each period because all device fabrication parameters were constant for the wafers in each set, within each period. The data clearly indicates significant increases in device yields for each time period when the two-step epitaxial growth process was used instead of the conventional epitaxial growth processes used by vendors A and B.

During the fifth time period, the device fabricator processed the wafers from vendors A and B in the customary manner. In each case, a 31.0% yield was obtained. The device manufacturer during this period also processed a group of wafers made with the unique two-step epitaxial process of the present invention. However, this set of wafers also were subjected to the oxidation step according to the present invention, immediately prior to device fabrication. The result was a yield of 51.0%.

This test data indicates that the use of the two-step epitaxial growth process increased yields substantially over conventional processes, usually in the area of 5% to 10%, although the increase in the fourth time period was higher. However, when the oxidation step of the present invention was utilized in conjunction with the two-step epitaxial growth process, an approximate 20% increase in yield was obtained. This dramatic increase is believed to result from the synergistic effect of the combination.

While only a single preferred embodiment of the present invention has been disclosed herein for purposes of illustration, it is obvious that many modifications and variations could be made thereto. It is intended to cover all of these variations and modifications which fall within the scope of the present invention, as defined by the following claims:

We claim:

1. A method for forming an epitaxial wafer from a silicon substrate, the method comprising the steps of:
    slicing the substrate to form a wafer;
    annealing the wafer; and
    forming an epitaxial layer of given resistivity of the surface of the wafer by (a) growing an epitaxial layer of said given resistivity, (b) removing a substantial portion, but not all, of the grown epitaxial layer, and (c) regrowing the epitaxial layer of said given resistivity to the required thickness.

2. The method of claim 1, further comprising the step of: forming an oxide layer on the wafer surface.

3. The method of claim 1, wherein the step of growing an epitaxial layer comprises the steps of:
    (1) heating the wafer;
    (2) growing an epitaxial layer several microns thick;
    (3) cooling the wafer; and
    (4) reheating the wafer.

4. The method of claim 1, wherein the step of removing a portion of the grown epitaxial layer comprises the step of removing substantially all of the grown epitaxial layer except for approximately one micron thereof.

5. The method of claim 1, wherein the oxygen content of the substrate is approximately 17 to 20 parts per million.

6. The method of claim 1, wherein the sliced wafer has a backside surface and further comprising the step of subjecting the backside surface of the wafer to mechanical damage.

7. The method of claim 1, wherein the step of annealing the wafer comprises the steps of:
(1) heating the wafer for approximately five hours at 900° C. in a nitrogen atmosphere;
(2) permitting the heated wafer to cool rapidly;
(3) removing any deposited oxide from the wafer; and
(4) cleaning the wafer surface.

8. The method of claim 3, wherein the step of growing an epitaxial layer further comprises the step of removing a portion of the substrate surface prior to growing the epitaxial layer.

9. The method of claim 3, wherein the step of removing a portion of the substrate surface comprises the step of removing approximately 3500 angstroms to 5000 angstroms of substrate.

10. The method of claim 3, wherein the step of heating the wafer comprises the step of heating the wafer to approximately 1100° C.

11. The method of claim 6, wherein the step of subjecting the backside surface to mechanical damage comprises the step of scribing the backside surface to form concentric circles.

12. The method of claim 6, further comprising the step of polishing the backside surface of the wafer.

13. A method for forming an epitaxial wafer from a silicon substrate, the method comprising the steps of:
slicing the substrate to form a wafer;
annealing the wafer;
forming an epitaxial layer; and
forming an oxide layer on the epitaxial layer by (a) heating the wafer to a first temperature, (b) removing a portion but not all of the epitaxial layer, (c) placing the wafer in an oxygen atmosphere for a given time period, and (d) gradually reducing the temperature to a second temperature.

14. The method of claim 13, wherein the step of heating the wafer comprises the step of slowly heating the wafer, in a nitrogen atmosphere, to approximately 1100° C.

15. The method of claim 13, wherein the step of removing a portion of the epitaxial layer comprises the step of etching away approximately 1200 angstroms of the epitaxial layer.

16. The method of claim 13, wherein the step of placing the wafer in an oxygen atmosphere comprises the step of heating the wafer for approximately 60 minutes in 3 liters/minute of oxygen.

17. The method of claim 13, wherein the step of gradually reducing the temperature comprises the step of reducing the temperature from approximately 1100° C. to approximately 700° C. over the time period of approximately 60 minutes.

18. The method of claim 13, wherein the step of forming an oxide layer comprises the step of forming an oxide layer from 1600 angstroms to 1800 angstroms thick.

19. The method of claim 13, wherein the step of forming an oxide layer occurs immediately prior to processing the wafer to form semiconductor devices thereon.

20. The method of claim 13, wherein the oxygen content of the substrate is approximately 17 to 20 parts per minute.

21. The method of claim 13, wherein the sliced wafer has a backside surface and further comprising the step of subjecting the backside surface of the wafer to mechanical damage.

22. The method of claim 13, wherein the step of annealing the wafer comprises the steps of:
(1) heating the wafer for approximately five hours at 900° C. in a nitrogen atmosphere;
(2) permitting the heated wafer to cool rapidly;
(3) removing any deposited oxide from the wafer; and
(4) cleaning the wafer surface.

23. The method of claim 15, wherein the step of etching comprises etching at a rate of approximately 75 angstroms per minute.

24. The method of claim 21, wherein the step of subjecting the backside surface to mechanical damage comprises the step of scribing the backside surface to form concentric circles.

25. The method of claim 21, further comprising the step of polishing the backside surface of the wafer.

26. A method of forming an epitaxial wafer from a silicon substrate, the method comprising:
slicing the substrate to form a wafer;
annealing the wafer;
forming an epitaxial layer by (a) growing an epitaxial layer, (b) removing a substantial portion but not all, of the grown layer, and (c) regrowing the epitaxial layer to the required thickness; and
forming an oxide layer by (i) heating the wafer to a first temperature, (ii) removing a portion of the epitaxial layer, (iii) placing the wafer in an oxygen atmosphere for a given time period, and (iv) gradually reducing the temperature to a second temperature.

27. The method of claim 26, wherein the step of growing an epitaxial layer comprises the steps of:
(1) heating the wafer;
(2) growing an epitaxial layer several microns thick;
(3) cooling the wafer; and
(4) reheating the wafer.

28. The method of claim 26, wherein the step of removing a portion of the grown epitaxial layer comprises the step of removing all of the grown epitaxial layer except for approximately one micron thereof.

29. The method of claim 26, wherein the step of growing an epitaxial layer further comprises the step of removing a portion of the substrate surface prior to growing the epitaxial layer.

30. The method of claim 26, wherein the sliced wafer has a backside surface and further comprising the step of subjecting the backside surface of the wafer to mechanical damage.

31. The method of claim 26, wherein the step of annealing the wafer comprises the steps of:
(1) heating the wafer for approximately five hours at 900° C. in a nitrogen atmosphere;
(2) permitting the heated wafer to cool rapidly;
(3) removing any deposited oxide from the wafer; and
(4) cleaning the wafer surface.

32. The method of claim 26, wherein the step of heating the wafer comprises the step of slowly heating the wafer, in a nitrogen atmosphere, to approximately 1100° C.

33. The method of claim 26, wherein the step of removing a portion of the epitaxial layer comprises the step of etching away approximately 1200 angstroms of the epitaxial layer.

34. The method of claim 26, wherein step of placing the wafer in an oxygen atmosphere comprises the step of heating the wafer for approximately 60 minutes in 3 liters/minute of oxygen.

35. The method of claim 26, wherein the step of gradually reducing the temperature comprises the step of reducing the temperature from approximately 1100° C. to approximately 700° C. over the time period of approximately 60 minutes.

36. The method of claim 26, wherein the step of forming an oxide layer comprises the step of forming an oxide layer from 1600 angstroms to 1800 angstroms thick.

37. The method of claim 26, wherein the step of forming an oxide layer occurs immediately prior to processing the wafer to form semiconductor devices thereon.

38. The method of claim 30, wherein the step of subjecting the backside surface to mechanical damage comprises the step of scribing the backside surface to form concentric circles.

* * * * *